United States Patent
Watanabe et al.

(10) Patent No.: US 11,003,528 B2
(45) Date of Patent: May 11, 2021

(54) MEMORY SYSTEM INCLUDING AN ERROR CORRECTION FUNCTION

(71) Applicant: Toshiba Memory Corporation, Minato-ku (JP)

(72) Inventors: Daiki Watanabe, Yokohama (JP); Yuchieh Lin, Yokohama (JP)

(73) Assignee: Toshiba Memory Corporation, Minato-ku (JP)

(*) Notice: Subject to any disclaimer, the term of this patent is extended or adjusted under 35 U.S.C. 154(b) by 273 days.

(21) Appl. No.: 15/919,809

(22) Filed: Mar. 13, 2018

(65) Prior Publication Data

US 2019/0087266 A1 Mar. 21, 2019

(30) Foreign Application Priority Data

Sep. 20, 2017 (JP) .............................. JP2017-180689

(51) Int. Cl.
*G06F 11/10* (2006.01)
*G06F 11/00* (2006.01)
(Continued)

(52) U.S. Cl.
CPC ...... *G06F 11/1068* (2013.01); *G06F 11/1012* (2013.01); *G11C 29/52* (2013.01); *H03M 13/2906* (2013.01); *H03M 13/2909* (2013.01); *H03M 13/6516* (2013.01); *G11C 2029/0411* (2013.01)

(58) Field of Classification Search
None
See application file for complete search history.

(56) References Cited

U.S. PATENT DOCUMENTS 7,526,710 B2 4/2009 Sawaguchi
8,042,030 B2 10/2011 Kanaoka et al.
(Continued)

FOREIGN PATENT DOCUMENTS

JP 2004-288283 10/2004
JP 2008-65969 3/2008
JP 2012-123880 A 6/2012

*Primary Examiner* — Justin R Knapp
(74) *Attorney, Agent, or Firm* — Oblon, McClelland, Maier & Neustadt, L.L.P.

(57) ABSTRACT

According to one embodiment, a memory system includes a nonvolatile memory, an encoding part configured to generate a plurality of component codes including a first component code and a second component code different from the first component code, by using, as an information symbol, at least one symbol of a plurality of symbols included in user data to be written into the nonvolatile memory, and a memory interface configured to write the plurality of component codes into the nonvolatile memory. The encoding part includes a plurality of encoders each configured to generate a parity corresponding to each of the plurality of component codes, and a first distributor configured to divide a first symbol string of the user data into a plurality of chunks, each of which has a first symbol length smaller than that of the first symbol string, and to input each of the plurality of chunks generated by the division, into any one of at least different two of the plurality of encoders. The memory interface is configured to write the first symbol string and parities corresponding to the first symbol string into the nonvolatile memory.

20 Claims, 9 Drawing Sheets

(51) Int. Cl.
*G11C 29/52* (2006.01)
*H03M 13/29* (2006.01)
*H03M 13/00* (2006.01)
*G11C 29/04* (2006.01)

(56) References Cited

U.S. PATENT DOCUMENTS

| | | |
|---|---|---|
| 9,397,706 B1* | 7/2016 | Steiner ............... H03M 13/2918 |
| 2007/0195894 A1 | 8/2007 | Shokrollahi et al. |
| 2011/0214039 A1* | 9/2011 | Steiner ................ G06F 11/1012 |
| | | 714/797 |
| 2012/0005560 A1* | 1/2012 | Steiner .................. H03M 13/09 |
| | | 714/780 |
| 2014/0129899 A1 | 5/2014 | Kumar et al. |
| 2016/0154697 A1* | 6/2016 | Teitel ................ H03M 13/2963 |
| | | 714/766 |
| 2019/0138390 A1* | 5/2019 | Fisher ................... G06F 11/108 |
| 2019/0296774 A1* | 9/2019 | Uchikawa ........... G06F 11/1012 |

* cited by examiner

MEMORY SYSTEM INCLUDING AN ERROR CORRECTION FUNCTION

CROSS-REFERENCE TO RELATED APPLICATIONS

This application is based upon and claims the benefit of priority from Japanese Patent Application No. 2017-180689, filed on Sep. 20, 2017; the entire contents of all of which are incorporated herein by reference.

FIELD

Embodiments described herein relate generally to a memory system.

BACKGROUND

In a memory system, in general, data is stored in an error correction encoded state to protect the stored data. Accordingly, when the data stored in the memory system is read therefrom, decoding is performed to the data in an error correction encoded state.

DETAILED DESCRIPTION

In general, according to one embodiment, a memory system includes a nonvolatile memory, an encoding part configured to generate a plurality of component codes including a first component code and a second component code different from the first component code, by using, as an information symbol, at least one symbol of a plurality of symbols included in user data to be written into the nonvolatile memory, and a memory interface configured to write the plurality of component codes into the nonvolatile memory. The encoding part includes a plurality of encoders each configured to generate a parity corresponding to each of the plurality of component codes, and a first distributor configured to divide a first symbol string of the user data into a plurality of chunks, each of which has a first symbol length smaller than that of the first symbol string, and to input each of the plurality of chunks generated by the division, into any one of at least different two of the plurality of encoders. The memory interface is configured to write the first symbol string and parities corresponding to the first symbol string into the nonvolatile memory.

Exemplary embodiments of a memory system will be explained below in detail with reference to the accompanying drawings. The present invention is not limited to the following embodiments.

In recent years, memory systems utilising a nonvolatile memory, such as a NAND type flash memory, are used in various places, by taking advantage of its characteristic of high speed. However, data read from a nonvolatile memory may include an error caused by a lapse of time since it was recorded into the nonvolatile memory, and/or an error caused by a noise or the like generated in reading/writing thereof. Accordingly, in general, an encoding process using an error correction code is executed to data to be recorded into the nonvolatile memory, and, when the data is read, a decoding process using this error correction code is executed to the data to remove an error included in the data thus read.

Figure 1:
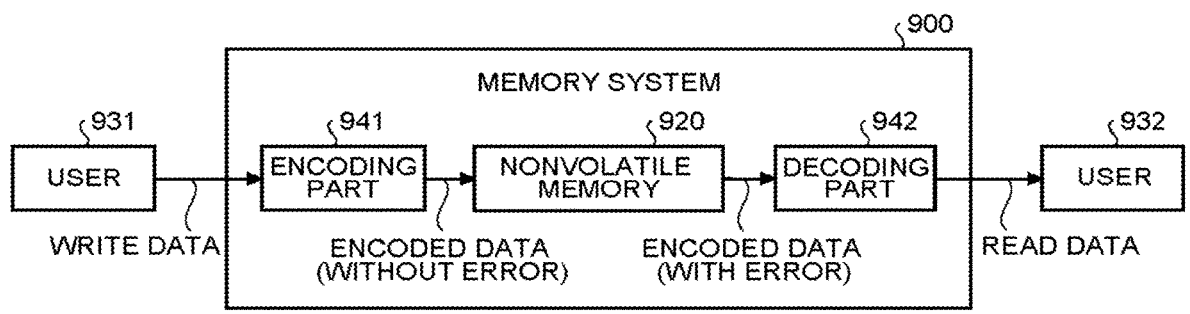
FIG. 1 is a diagram for explaining a general flow of an operation for protecting data with an error correction code.

FIG. 1 is a diagram for explaining a general flow of an operation for protecting data with an error correction code. Here, a term "user" in this explanation may represent an information processing apparatus (which will also be referred to as "host"), such as a personal computer, server apparatus, portable information equipment, or digital still camera, for example.

A user 931 transmits data treated as a writing object (which will be referred to as "write data", hereinafter) to a memory system 900. The memory system 900 encodes the write data received from the user 931, by using an encoding part 941, and writes the encoded data (codeword) thus generated into a nonvolatile memory 920. Accordingly, the encoded data to be written into the nonvolatile memory 920 basically does not include an error.

Encoded data stored in the nonvolatile memory 920 is read therefrom in response to a reading request from a user 932, for example. Here, the encoded data thus read may include an error. In light of this, a decoding part. 942 is used to execute decoding to the encoded data thus read, while removing an error included therein, whereby the original encoded data is restored. Thereafter, the original encoded data or the non-encoded write data obtained by restoration is transmitted to the user 932. Here, the user 932 that issued the reading request may be the same user as the user 931 that issued the writing request, or may be a different user from the user 931.

For an error correction function implemented in the memory system described above, a multi-dimensional error correction code, such as a product code, may be applied. Here, the multi-dimensional error correction code refers to one where at least one or more symbols, which are constituent units of the error correction code, are multiply protected by at least two difference component codes, respectively. Each component code is smaller than the whole multi-dimensional error correction code. Further, one symbol is formed of, for example, one hit (an element of a binary field), or an alphabetical element of a finite field or the like other than the binary field.

Figure 2:
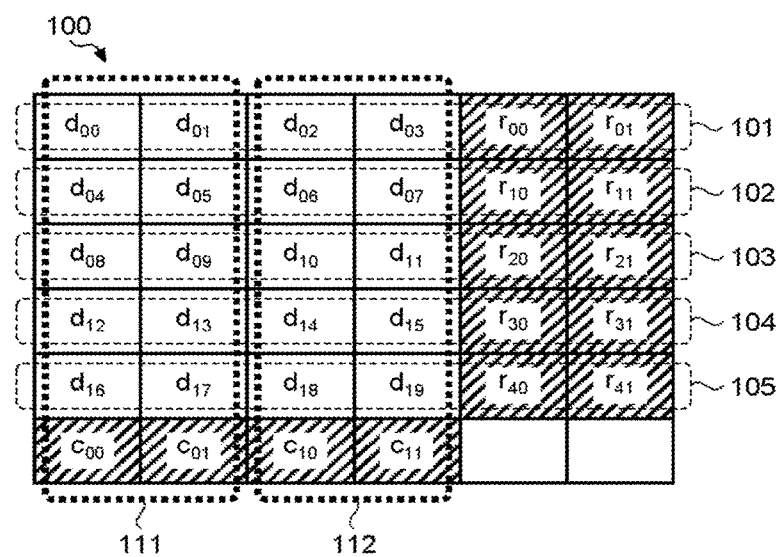
FIG. 2 is a diagram illustrating an example of a product code composed of two-dimensional component codes.

FIG. 2 is a diagram illustrating an example of a product code composed of two-dimensional component codes. In the product code 100 illustrated in FIG. 2, all the symbols are doubly protected by component codes in a row direction (which will be referred to as "dimension 1") and a column direction (which will be referred to as "dimension 2"). However, the multi-dimensional error correction code is not limited to this example, but may be formed of a Generalized Low Density Parity Check Code (generalized LDPC code) or the like, for example. In the case of an ordinary multi-dimensional error correction code including a generalized LDPC code, the protection multiplicity may be different for every symbol. Further, in this case, the component codes cannot be divided into groups, such as the dimension 1 and the dimension 2, but this technique can be applied to such a code configuration.

The product code 100 illustrated in FIG. 2 is composed of twenty information bits $d_{00}$ to $d_{19}$ and fourteen parities $r_{00}$ to $r_{41}$ and $c_{00}$ to $c_{11}$. Hereinafter, an arbitrary information bit is denoted by $d_k$, the j-th parity in the i-th component code of the dimension 1 is denoted by $r_{ij}$, and the j-th parity in the i-th component code of the dimension 2 is denoted by $c_{ij}$. Further, the product code 100 illustrated in FIG. 2 includes five component codes 101 to 105 of the dimension 1, and two component codes 111 and 112 of the dimension 2. Each of the component codes 101 to 105 of the dimension 1 includes four information bits and two parities. Each of the component codes 111 and 112 of the dimension 2 includes ten information bits and two parities.

Figure 3:
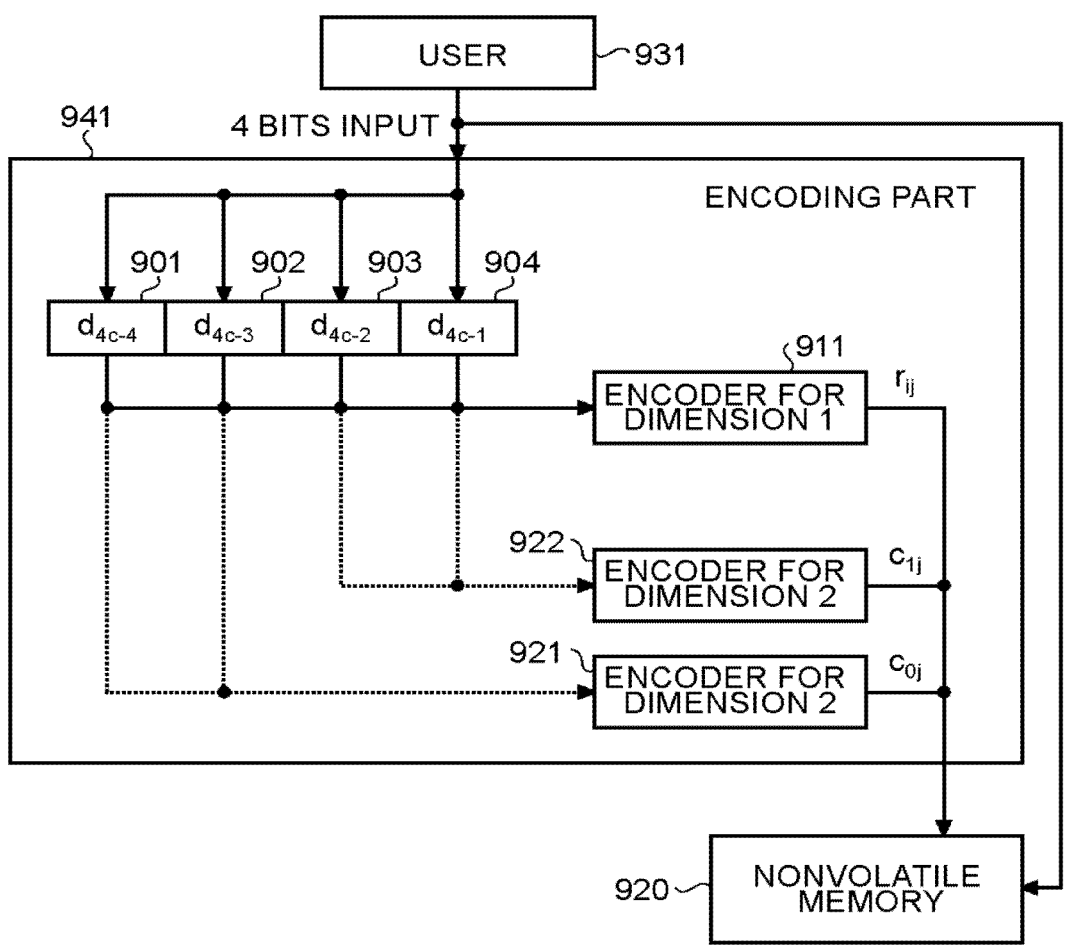
FIG. 3 is a block diagram illustrating an example of an encoding part configured to generate the product code illustrated in FIG. 2.

FIG. 3 is a block diagram illustrating an example of an encoding part configured to generate the product code illustrated in FIG. 2. As illustrated in FIG. 3, in order to efficiently encode the product code 100, the encoding part 941 is configured to receive input of four information bits in user data in one cycle, and to simultaneously execute encoding in the direction of the dimension 1 and encoding in the direction of the dimension 2 with respect to the four information bits thus input. The four information bits input from the user 931 in each cycle are temporarily held in four buffers 901 to 904 prepared for the respective input bits, and are then input into an encoder 911 for the dimension 1 and two encoders 921 and 922 for the dimension 2. At this time, the first half two of the four information bits are input into the encoder 921 for the dimension 2, and the second half two of them are input into the encoder 922 for the dimension 2.

In the c-th cycle, the encoder 911 for the dimension 1 generates parities of the c-th component code of the dimension 1, and outputs these parities. The two encoders 921 and 922 for the dimension 2 generate respective parities with respect to the component codes of the dimension 2, after all the information hits are input. The parities of the dimension 1 generated by the encoder 911 for the dimension 1, and the parities generated by the encoders 921 and 922 for the dimension 2 are connected to user data input from the user 931. Consequently, a codeword (encoded data) is generated. The codeword thus generated is written into the nonvolatile memory 920.

In the configuration described above, the number of wiring lines connecting the buffers and the encoders for the dimension 2 to each other depends on the number of component codes of each of the dimensions. Accordingly, in order to change the encoding rate of the multi-dimensional error correction code by changing the number of component codes, it is necessary to change the wiring lines connecting the buffers and the encoders for the dimension to each other. This means that, in order to change the encoding rate, a different encoding part needs to be used. This is a cause of hindering the versatility of the encoding part.

Figure 4:
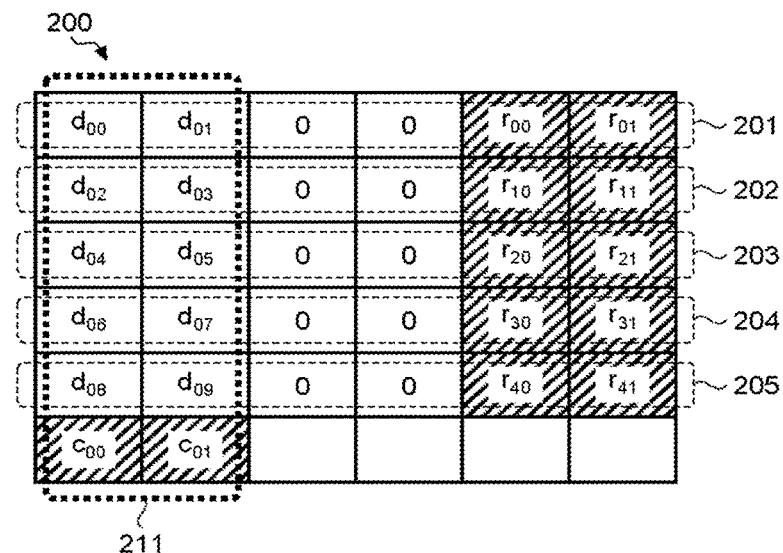
FIG. 4 is a diagram illustrating another example of a two-dimensional product code.

Further, when the encoding part 941 illustrated in FIG. 3 is applied to an error correction code having a different structure, there is a case where the throughput is lowered. FIG. 4 is a diagram illustrating another example of the two-dimensional product code. The product code 200 illustrated in FIG. 4 is composed of ten information bits $d_{00}$ to $d_{09}$, twelve parities $r_{00}$ to $r_{41}$ and $c_{00}$ to $c_{01}$, and ten dummy bits ("0" bits). Further, the product code 200 includes five component codes 201 to 205 of the dimension 1, and one component code 211 of the dimension 2. Each of the component codes 201 to 205 of the dimension 1 includes two information bits, two dummy bits, and two parities. The component code 211 of the dimension 2 includes ten information bits and two parities.

As illustrated in FIG. 4, dummy bits are embedded in two columns on the right side of information bits arranged in two columns. With this arrangement, as in the product code 100 illustrated in F. 2, the product code 200 can be encoded by using the encoding part 941 illustrated in FIG. 3. However, in this case, the number of information bits input into the encoding part 941 in one cycle becomes a half (two bits) of that of the product code 100 illustrated in FIG. 2, and so the throughput of the encoding part 941 is lowered by half. As in this case, when the same encoding part is used to execute encoding with a different encoding rate, the throughput may be lowered.

Accordingly, in the following embodiments, an explanation will be given, by example, of a memory system that can execute encoding with a different encoding rate, without lowering the throughput. In the following embodiments, a two-dimensional product code is illustrated as an example of an error correction code; however, this is not limiting. A multi-dimensional error correction code may be used, where at least one or more symbols, which are constituent units of the error correction code as described above, are multiply protected by at least two different component codes.

First Embodiment

Figure 5:
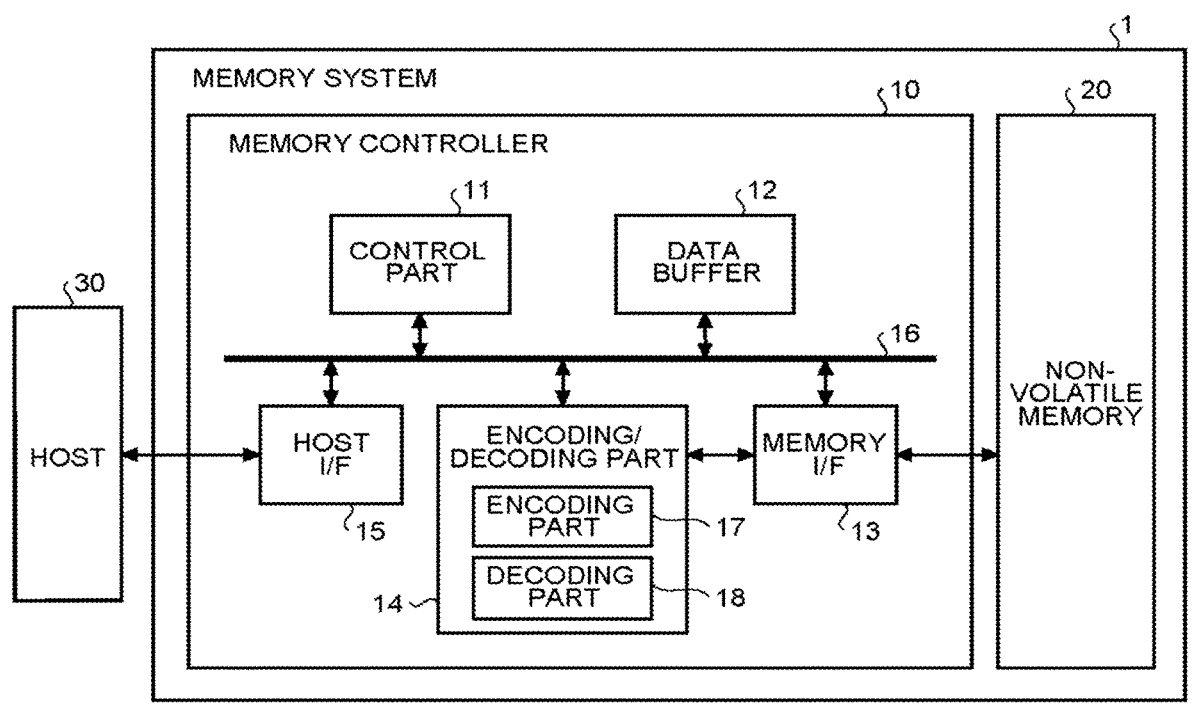
FIG. 5 is a block diagram illustrating a schematic configuration example of a memory system according to a first embodiment.

First, an explanation will be given of a memory system according to a first embodiment in detail with reference to drawings. FIG. 5 is a block diagram illustrating a schematic configuration example of a memory system according to the first embodiment. As illustrated in FIG. 5, the memory system 1 includes a memory controller 10 and a nonvolatile memory 20. The memory system 1 can be connected to a host 30, and is illustrated in a state connected to the host 30 in FIG. 5. The host 30 may be electronic equipment, such as a personal computer or portable terminal device, for example.

The nonvolatile memory 20 is a nonvolatile memory that stores data in a nonvolatile manner, and is a NAND type flash memory (which will be simply referred to as "NAND memory"), for example. The following description will take as an example a case where a NAND memory is used as the nonvolatile memory 20. However, as the nonvolatile memory 20, a storage device other than the NAND memory may be used, such as a three-dimensional structure flash memory, Resistance Random Access Memory (ReRAM), or Ferroelectric Random Access Memory (FeRAM). Further, it is not essential that the nonvolatile memory 20 is a semiconductor memory. This embodiment can be applied to various storage media other than the semiconductor memory.

The memory system 1 may be a memory card or the like in which the memory controller 10 and the nonvolatile memory 20 are formed as one package, or may be a Solid State Drive (SSD) or the like.

The memory controller 10 controls writing into the nonvolatile memory 20 in accordance with a writing request from the host 30. Further, the memory controller 10 controls reading from the nonvolatile memory 20 in accordance with a reading request from the host 30. The memory controller 10 includes a host interface (host I/F) 15, a memory interface (memory I/F) 13, a control part 11, an encoding/decoding part (codec) 14, and a data buffer 12. The host I/F 15, the memory I/F 13, the control part 11, the encoding/decoding part 14, and the data buffer 12 are connected to each other by an internal bus 16.

The host I/F 15 performs a process conforming to an interface standard with respect to the host 30, and outputs, to the internal bus 16, a command, user data treated as a writing object, or the like received from the host 30. Further, the host I/F 15 transmits, to the host 30, user data read from the nonvolatile memory 20 and restored, a response from the control part 11, or the like.

The memory I/F 13 performs a writing process into the nonvolatile memory 20, on the basis of an instruction from the control part 11. Further, the memory I/F 13 performs a reading process from the nonvolatile memory on the basis of an instruction from the control part 11.

The control part 11 conducts overall control on the respective components of the memory system 1. When receiving a command from the host 30 via the host I/F 15, the control part. 11 performs control in accordance with the command. For example, in accordance with a command from the host 30, the control part 11 instructs the memory I/F 13 to write user data and parities into the nonvolatile memory 20. Further, in accordance with a command from the host 30, the control part 11 instructs the memory I/F 13 to read user data and parities from the nonvolatile memory 20.

Further, when receiving a writing request from the host 30, the control part 11 determines a storage area (memory area) on the nonvolatile memory 20 with respect to user data accumulated in the data buffer 12. In other words, the control part 11 manages writing destinations for user data. The correlations between the logical addresses of user data received from the host 30 and the physical addresses representing storage areas on the nonvolatile memory 20 that store the user data are stored as an address conversion table.

Further, when receiving a reading request from the host 30, the control part 11 converts a logical address specified by the reading request into a physical address by using the address conversion table described above, and instructs the memory I/F 13 to perform reading from this physical address.

In a NAND memory, in general, writing and reading are performed in units of data called "page", and erasing is performed in units of data called "block". In this embodiment, a plurality of memory cells connected to the same word line will be referred to as "memory cell group". Where each memory cell is a single level cell (SLC), one memory cell group corresponds to one page. Where each memory cell is a multi level cell (MLC), one memory cell group corresponds to a plurality of pages. Further, each memory cell is connected to a word line, and is further connected to a bit line. Accordingly, each memory cell can be identified by an address that identifies a word line and an address that identifies a bit line.

The data buffer 12 temporarily stores user data received by the memory controller 10 from the host 30 until the user data is stored into the nonvolatile memory 20. Further, the data buffer 12 temporarily stores user data read from the nonvolatile memory 20 until the user data is transmitted to the host 30. As the data buffer 12, for example, a general purpose emory may be used, such as a Static Random Access Memory (SRAM) or Dynamic Random Access Memory (DRAM).

User data transmitted from the host 30 is transferred through the internal bus 16, and is once stored into the data buffer 12. The encoding/decoding part 14 encodes user data stored in the nonvolatile memory 20, and thereby generates a codeword. Further, the encoding/decoding part 14 decodes a reception word read from the nonvolatile memory 20, and thereby restores user data. Accordingly, the encoding/decoding part 14 includes an encoding part (Encoder) 17 and a decoding part (Decoder) 18. Here, data to be encoded by the encoding/decoding part 14 may include control data or the like to be used in the memory controller 10, other than user data.

Next, an explanation will be given of a writing process according to this embodiment. When writing into the nonvolatile memory 20 is to be performed, the control part 11 instructs the encoding part 17 to encode user data. At this time, the control part 11 determines the storage location (storage address) of a codeword in the nonvolatile memory 20, and indicates also the storage location thus determined to the memory I/F 13.

Figure 7:
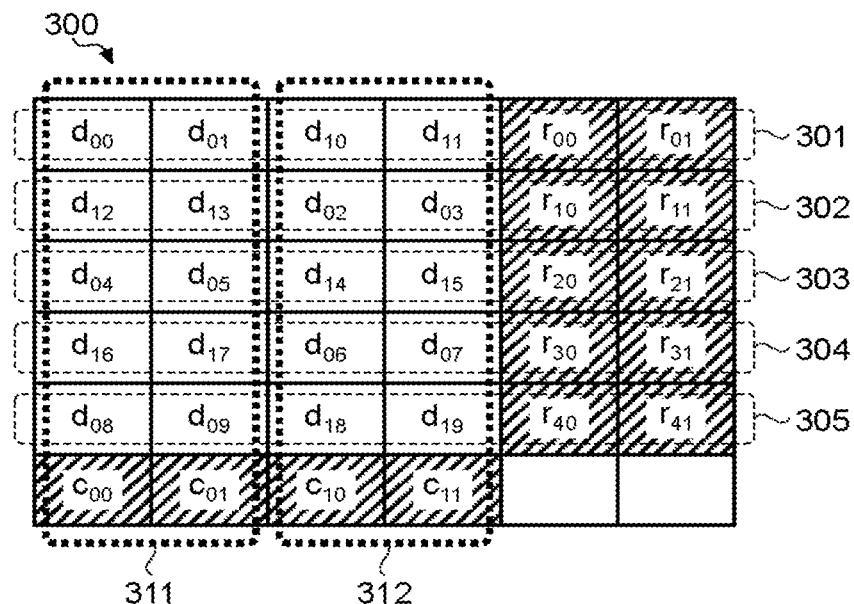
FIG. 7 is a diagram illustrating an example of a multi-dimensional r correction code to be generated in the first embodiment, which is an example of a product code where the number of component codes of a dimension 1 is five and the number of component codes of a dimension 2 is two.
Figure 8:
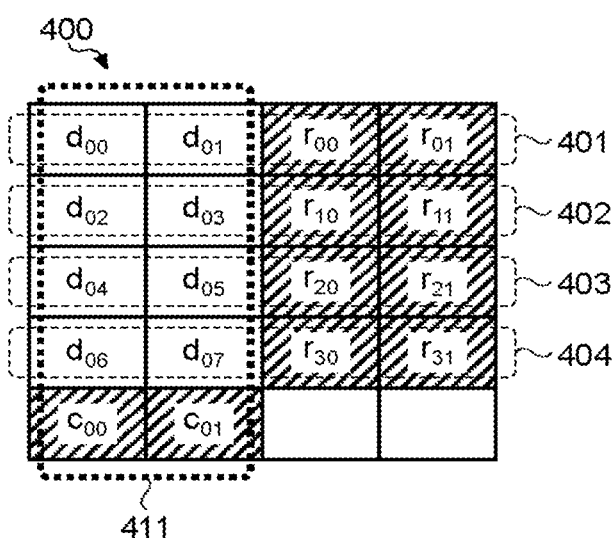
FIG. 8 is a diagram illustrating an example of a multi-dimensional error correction code to be generated in the first embodiment, which is an example of a product code where the number of component codes of the dimension 1 is four and the number of component codes of the dimension 2 is one.
Figure 9:
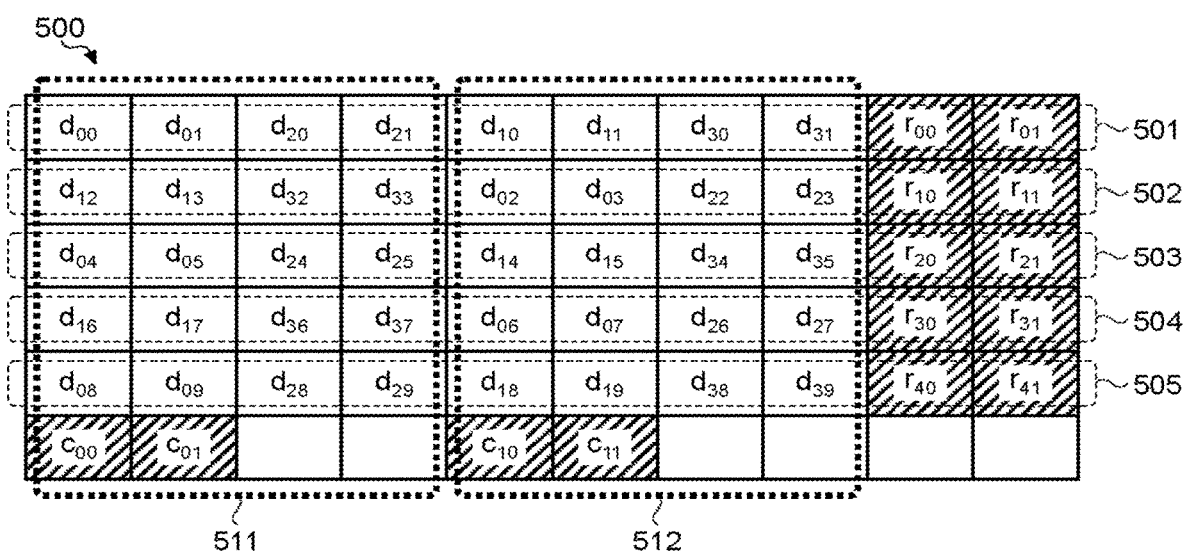
FIG. 9 is a diagram illustrating an example of a multi-dimensional error correction code to be generated in the first embodiment, which is another example of a product code where the number of component codes of the dimension 1 is five and the number of component codes of the dimension 2 is two.

On the basis of the instruction from the control part 11, the encoding part 17 encodes the user data in the data buffer 12, thereby generates the codeword. As the encoding system, for example, an encoding system using a hose-Chaudhuri-Hocquenghem (BCH) code or Reed Solomon (RS) code may be adopted. The codeword generated by the encoding part 17 is a multi-dimensional error correction code as illustrated in FIGS. 7 to 9 described later. The memory I/F 13 performs control to store the codeword into the storage location on the nonvolatile memory 20 indicated by the control part 11.

Next, an explanation will be given of a reading process from the nonvolatile memory 20 according to this embodiment. When reading from the nonvolatile memory 20 is to be performed, the control part 11 instructs the memory I/F 13 to perform reading, while specifying an address on the nonvolatile memory 20. Further, the control part 11 instructs the decoding part 18 to start decoding. In accordance with the instruction from the control part 11, the memory I/F 13 reads a reception word from the specified address on the nonvolatile memory 20, and inputs the reception word thus read into the decoding part 18. The decoding part 18 decodes this reception word read from the nonvolatile memory 20.

Figure 6:
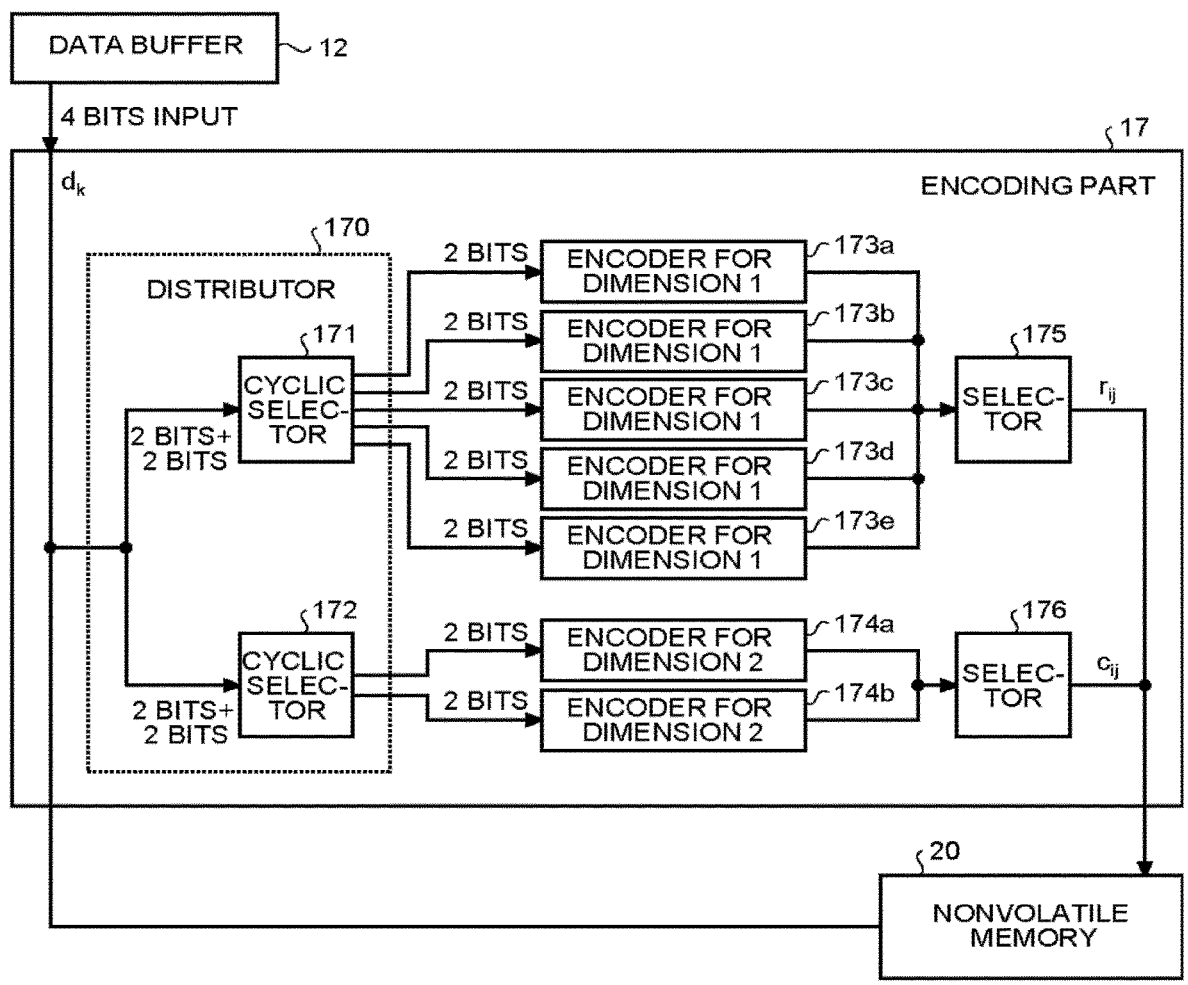
FIG. 6 is a block diagram illustrating a schematic configuration example of an encoding part according to the first embodiment.

Next, an explanation will be given of a more specific configuration of the encoding part 17 illustrated in FIG. 5 in detail with reference to drawings. FIG. 6 is a block diagram illustrating a schematic configuration example of an encoding part according to the first embodiment. Here, in FIG. 6, for the sake of clarification of the explanation, the parts of the memory controller 10 other than the encoding part are omitted.

As illustrated in FIG. 6, the encoding part 17 includes a distributor 170 that distributes information bits input from the data buffer 12 in each cycle; encoders 173a to 173e for the dimension 1 in the same number as the number of component codes (five) of the dimension 1; encoders 174a and 174b for the dimension 2 in the same number as the number of component codes (two) of the dimension 2; and selectors 175 and 176 provided for the respective dimensions. Further, the distributor 170 includes cyclic selectors 171 and 172 provided for the respective dimensions.

User data input as a writing object, together with a writing request, from the host 30 is temporarily stored into the data buffer 12 as described above. The user data stored in the data buffer 12 is input into the encoding part 17 by four information bits in each cycle.

The four information bits thus input into the encoding part 17 are written into the nonvolatile memory 20 via the memory I/F 13, and are also input into the distributor 170. The distributor 170 divides the four information bits into a plurality of (two, in this example) groups (each of which will be referred to as "chunk"), each of which is composed of one or more bits (two bits, in this example), and sequentially inputs the plurality of chunks thus generated into the cyclic selectors 171 and 172 for the respective dimensions.

The cyclic selector 171 for the dimension 1 inputs each of the plurality of chunks, which have been sequentially input therein, into any one of the encoders 173a to 173e for the dimension 1, by keeping the order of chunks and in accordance with a set period. For example, in a case where the number of component codes of the dimension 1 is five and the five encoders 173a to 173e for the dimension 1 are used, the period of the cyclic selector 171 is set to five cycles. Here, setting of the period to the cyclic selectors 171 and 172 may be performed by the distributor 170.

When all the information bits of the user data stored in the data buffer 12 have been distributed into the encoders 173a to 173e for the dimension 1 via the distributor 170, the encoders 173a to 173e for the dimension 1 encode the plurality of chunks input into the respective encoders, to generate parities of the dimension 1, and output parities of the dimension 1 thus generated into the selector 175 for the dimension 1. For example, in a case where two chunks, which are specifically a chunk composed of information bits $d_{00}$ and $d_{01}$ and a chunk composed of information bits $d_{10}$ and $d_{11}$, are sequentially input into the encoder 173a for the dimension 1, the encoder 173a for the dimension 1 generates parities $r_{00}$ and $r_{01}$ from the information bits $r_{00}$, $d_{01}$, $d_{10}$, and $d_{11}$, and outputs the parities $r_{00}$ and $r_{01}$ thus generated into the selector 175. In the same way, the encoders 173b to 173e for the dimension 1 generate parities $r_{10}$ to $r_{41}$ from sets of two chunks sequentially input therein, and output the parities $r_{10}$ to $r_{41}$ into the selector 175.

On the other hand, the cyclic selector 172 inputs each of the plurality of chunks, which have been sequentially input therein, into either one of the encoders 174a and 174b for the dimension 2, by keeping the order of chunks and in accordance with a predetermined period. For example, in a case where the number of component codes of the dimension 2 is two and the two encoders 174a and 174b for the dimension 2 are used, the period of the cyclic selector 172 is set to two cycles. In this case, the information bits input into the distributor 170 in one cycle are divided into two chunks, and then the first chunk is input into the first encoder 174a for the dimension 2, and the second chunk is input into the second encoder 174b for the dimension 2.

When all the information bits of the user data stored in the data buffer 12 have been distributed into the encoders 174a and 174b for the dimension 2 via the distributor 170, the encoders 174a and 174b for the dimension 2 execute encoding to the information bits input into the respective encoders, to generate parities of the dimension 2, and output the parities thus generated into the selector 176 for the dimension 2. For example, when distribution of all the information bits $d_{00}$ to $d_{19}$ of the user data has been completed by the distributor 170, the encoder 174a for the dimension 2 encodes information bits $d_{00}$, $d_{01}$, $d_{04}$, $d_{05}$, $d_{08}$, $d_{09}$, $d_{12}$, $d_{13}$, $d_{16}$, and $d_{17}$ input therein, to generate parities $c_{00}$ and $c_{01}$, and outputs the parities $c_{00}$ and $c_{01}$ thus generated into the selector 176. In the same way, when distribution of all the information bits $d_{00}$ to $d_{19}$ of the user data has been completed by the distributor 170, the encoder 174b for the dimension 2 encodes information bits $d_{02}$, $d_{03}$, $d_{06}$, $d_{07}$, $d_{10}$, $d_{11}$, $d_{14}$, $d_{15}$, $d_{18}$, and $d_{19}$ input therein, to generate parities $c_{10}$ and $c_{11}$, and outputs the parities $c_{10}$ and $c_{11}$ thus generated into the selector 176.

When the selector 175 for the dimension 1 receives input of the parities $r_{00}$ to $r_{41}$ of the dimension 1 from the respective encoders 173a to 173e for the dimension 1, the selector 175 inputs these input parities $r_{00}$ to $r_{41}$ into the memory I/F 13. Then, the memory I/F 13 writes the input parities $r_{00}$ to $r_{41}$ of the dimension 1 into the nonvolatile memory 20. Similarly, when the selector 176 for the dimension 2 receives input of the parities $c_{00}$ to of the dimension 2 from the respective encoders 174a and 174b for the dimension 2, the selector 176 inputs these input parities $c_{00}$ to $c_{11}$ into the memory I/F 13. Then, the memory I/F 13 writes the input parities $c_{00}$ to $c_{11}$ of the dimension 2 into the nonvolatile memory 20. Consequently, for example, a product code 300, which will be described later with reference to FIG. 7, is written into the nonvolatile memory 20.

FIG. 7 is a diagram illustrating an example of a multi-dimensional error correction code to be generated by the encoding part 17, which is an example of a product code where the number of component codes of the dimension 1 is five and the number of component codes of the dimension 2 is two. The product code 300 illustrated in FIG. 7 is composed of totally twenty information bits $d_{00}$ to $d_{19}$ and totally fourteen parities $r_{00}$ to $r_{41}$ and $c_{00}$ to $c_{11}$, as in the product code 100 illustrated in FIG. 2. However, in the product code 300, the array of information bits does not agree to the array of information bits of user data.

When such a product code 300 is to be generated, in the encoding part 17, the period of the cyclic selector 171 for the dimension 1 is set to five cycles and the period of the cyclic selector 172 for the dimension 2 is set to two cycles. The distributor 170 divides the four information bits input therein in each cycle into two chunks, each of which is composed of two information bits, and sequentially inputs the two chunks thus generated into the respective cyclic selectors 171 and 172.

More specifically, in the generating operation of the product code 300, the totally twenty information bits $d_{00}$ to $d_{19}$ are input into the encoding part 17 by four information bits in each cycle. The information bits thus input are sequentially written into the nonvolatile memory 20 via the memory I/F 13, and are also input into the distributor 170 inside the encoding part 17.

First, when receiving input of four information bits $d_{00}$ to $d_{03}$, the distributor 170 divides these information bits $d_{00}$ to $d_{03}$ to generate two chunks ($d_{00}$, $d_{01}$) and ($d_{02}$, $d_{00}$), and inputs these chunks into the respective cyclic selectors 171 and 172. Thereafter, the distributor 170 operates in the same way, and thereby sequentially generates chunks ($d_{04}$, $d_{05}$)

and $(d_{06}, d_{07})$, $(d_{08}, d_{09})$ and $(d_{10}, d_{11})$, $(d_{12}, d_{13})$ and $(d_{14}, d_{15})$ and $(d_{16}, d_{17})$ and $(d_{18}, d_{19})$.

With respect to the chunks $(d_{00}, d_{01})$ to $(d_{18}, d_{19})$ input therein in order, the cyclic selector 171 for the dimension 1 inputs these chunks into the encoders as follows: The first chunk $(d_{00}, d_{01})$ is input into the first encoder 173a for the dimension 1. The second chunk $(d_{02}, d_{03})$ is input into the second encoder 173b for the dimension 1. The third chunk $(d_{04}, d_{05})$ is input into the third encoder 173c for the dimension 1. The fourth chunk $(d_{06}, d_{07})$ is input into the fourth encoder 173d for the dimension 1. The fifth chunk $(d_{08}, d_{09})$ is input into the fifth encoder 173e for the dimension 1. Here, the period set to the cyclic selector 171 is five cycles. Accordingly, with respect to the sixth and subsequent chunks, the cyclic selector 171 inputs these chunks into the encoders as follows: The sixth chunk $(d_{10}, d_{11})$ is input into the first encoder 173a for the dimension 1. The seventh chunk $(d_{12}, d_{13})$ is input into the second encoder 173b for the dimension 1. The eighth chunk $(d_{14}, d_{15})$ is input into the third encoder 173c for the dimension 1. The ninth chunk $(d_{16}, d_{17})$ is input into the fourth encoder 173d for the dimension 1. The tenth chunk $(d_{18}, d_{19})$ is input into the fifth encoder 173e for the dimension 1.

On the other hand, the cyclic selector 172 for the dimension 2 alternately inputs the chunks $(d_{00}, d_{01})$ to $(d_{18}, d_{19})$ input therein in order, into the encoders 174a and 174b for the dimension 2. Accordingly, the chunks $(d_{00}, d_{01})$, $(d_{04}, d_{05})$, $(d_{08}, d_{09})$, $(d_{12}, d_{13})$, and $(d_{16}, d_{17})$ are input into the encoder 174a for the dimension 2, and the chunks $(d_{02}, d_{03})$, $(d_{06}, d_{07})$, $(d_{10}, d_{11})$, $(d_{14}, d_{15})$, and $(d_{18}, d_{19})$ are input into the encoder 174b for the dimension 2.

Here, combinations of the encoders 173a to 173e for the dimension 1 and the encoders 174a and 174b for the dimension 2, into which the chunks are input, are specified as follows: The chunk $(d_{00}, d_{01})$ is input into the combination of the encoder 173a for the dimension 1 and the encoder 174a for the dimension 2. The chunk $(d_{02}, d_{03})$ is input into the combination of the encoder 173b for the dimension 1 and the encoder 174b for the dimension 2. The chunk $(d_{04}, d_{05})$ is input into the combination of the encoder 173c for the dimension 1 and the encoder 174a for the dimension 2. The chunk $(d_{06}, d_{07})$ is input into the combination of the encoder 173d for the dimension 1 and the encoder 174b for the dimension 2. The chunk $(d_{08}, d_{09})$ is input into the combination of the encoder 173e for the dimension 1 and the encoder 174a for the dimension 2. The chunk $(d_{10}, d_{11})$ is input into the combination of the encoder 153a for the dimension 1 and the encoder 174b for the dimension 2. The chunk $(d_{12}, d_{13})$ is input into the combination of the encoder 173b for the dimension 1 and the encoder 174a for the dimension 2. The chunk $(d_{14}, d_{15})$ is input into the combination of the encoder 173c for the dimension 1 and the encoder 174b for the dimension 2. The chunk $(d_{16}, d_{17})$ is input into the combination of the encoder 173d for the dimension 1 and the encoder 174a for the dimension 2. The chunk $(d_{18}, d_{19})$ is input into the combination of the encoder 173e for the dimension 1 and the encoder 174b for the dimension 2.

As described above, according to this embodiment, when the number of chunks (ten) generated from user data is equal to or smaller than the product ($10=5\times2$) obtained by multiplying the number of encoders 173a to 173e (five) for the dimension 1 by the number of encoders 174a and 174b (two) for the dimension 2, the distributor 170 determines the combinations of the encoders for the dimension 1 and the encoders for the dimension 2, which serve as chunk input destinations, such that a combination of an encoder for the dimension 1 and an encoder for the dimension 2, into which one chunk is to be input, does not overlap with a combination of an encoder for the dimension 1 and an encoder for the dimension 2, into which another chunk is to be input. In other words, the distributor 170 determines the number of cycles in a period to be set to the cyclic selector 171 for the dimension 1, and the number of cycles in a period to be set to the cyclic selector 172 for the dimension 2, such that a combination of encoders for the respective dimensions into which one chunk is to be input does not overlap with a combination of encoders for the respective dimensions into which another chunk is to be input.

When all the information bits of the user data stored in the data buffer 12 have been distributed into the encoders 73a to 173e for the dimension 1 via the distributor 170, the encoders 173a to 173e for the dimension 1 executes encoding to the chunks input into the respective encoders, and thereby generates parities of the dimension 1. For example, the encoder 173a for the dimension 1 executes encoding to the chunk $(d_{00}, d_{01})$ and $(d_{10}, d_{11})$ input therein, and thereby generates the parities $r_{00}$ and $r_{01}$. Thereafter, the encoders 173a to 173e for the dimension 1 output the parities $r_{00}$ to $r_{41}$ thus generated into the selector 175.

Similarly, when all the information bits of the user data stored in the data buffer 12 have been distributed into the encoders 174a and 174b for the dimension 2 via the distributor 170, the encoders 174a and 174b for the dimension 2 execute encoding to the chunks input into the respective encoders, and thereby generates parities of the dimension 2. For example, the encoder 174a for the dimension 2 executes encoding to the chunks $(d_{00}, d_{01})$, $(d_{04}, d_{05})$, $(d_{08}, d_{09})$, $(d_{12}, d_{13})$, and $(d_{16}, d_{17})$ input therein, and thereby generates the parities $c_{00}$ and $c_{01}$ of the dimension 2. Thereafter, the encoders 174a and 174b for the dimension 2 output the parities $c_{00}$ and $c_{11}$ thus generated into the selector 176.

The parities $r_{00}$ to $r_{41}$ of the dimension 1 and the parities $c_{00}$ to $c_{11}$ of the dimension 2 thus input into the selectors 175 and 176 are sequentially written into the nonvolatile memory 20 via the memory I/F 13. Consequently, the product code 300 illustrated in FIG. 7 is stored into the nonvolatile memory 20.

FIG. 8 is a diagram illustrating an example of a product code where the number of component codes of the dimension 1 is four and the number of component codes of the dimension 2 is one. The product code 400 illustrated in FIG. 8 is composed of totally eight information bits $d_{00}$ to $d_{07}$ and totally ten parities $r_{00}$ to $r_{31}$ and $c_{00}$ to $c_{01}$.

When such a product code 400 is to be generated, in the encoding part 17, the period of the cyclic selector 171 for the dimension 1 is set to four cycles and the period of the cyclic selector 172 for the dimension 2 is set to one cycle. Further, four information bits are input into the encoding part 17 in one cycle. The distributor 170 divides the four information bits thus input therein, to generate two chunks, and inputs the two chunks thus generated into the respective cyclic selectors 171 and 172. The cyclic selector 171 for the dimension 1 inputs the two chunks input therein in each cycle, into the encoders 173a to 173e for the dimension 1 in order. On the other hand, the cyclic selector 172 for the dimension 2 inputs both of the two chunks input therein in each cycle, into the first column encoder 174a for the dimension 2, and does not input the chunks into the second column encoder 174b for the dimension 2.

As described above, by changing the period of the cyclic selector or selectors 171 and/or 172, the encoding part 17 according to this embodiment can be applied to a multidimensional error correction code having a different encoding rate and a different code structure, without changing its configuration and without lowering the throughput.

FIG. 9 is a diagram illustrating another example of a product code where the number of component codes of the dimension 1 is five and the number of component codes of the dimension 2 is two. The product code 500 illustrated in FIG. 9 is composed of totally forty information bits $d_{00}$ to $d_{39}$ and totally fourteen parities $r_{00}$ to $r_{41}$ and $c_{00}$ to $c_{11}$. Further, in the product code 500, the array of information bits does not agree to the array of information bits of user data.

When such a product code 500 is to be generated, as in the case where the product code 300 is to be generated, in the encoding part 17, the period of the cyclic selector 171 for the dimension 1 is set to five cycles and the period of the cyclic selector 172 for the dimension 2 is set to two cycles. Further, four information bits are input into the encoding part 17 in one cycle. The distributor 170 divides the four information bits input therein in one cycle, into two chunks, each of which is composed of two information bits, and sequentially inputs the two chunks thus generated into the respective cyclic selectors 171 and 172.

Here, the value is ten that is obtained by multiplying the period (five cycles) of the cyclic selector 171 for the dimension 1 by the period (two cycles) of the cyclic selector 172 for the dimension 2. Accordingly, the chunk generated for the i-th time and the chunk generated for the i+10-th time in the distributor 170 are input into the same combination of an encoder for the dimension 1 and an encoder for the dimension 2, among the combinations of the encoders 173a to 173e for the dimension 1 and the encoders 174a and 174b for the dimension 2. For example, the first chunk ($d_{00}$, $d_{01}$) and the eleventh chunk ($d_{20}$, $d_{21}$) are input into the same combination of the encoder 173a for the dimension 1 and the encoder 174a for the dimension 2.

As described above, the encoding part 17 according to this embodiment allows the same combination of an encoder for the dimension 1 and an encoder for the dimension 2 to be allocated to a plurality of chunks. In other words, in combinations of at least two component codes among a plurality of component codes that constitute a multi-dimensional error correction code, there are one or more effective combinations each of which multiply protects at least one symbol in user data treated as a protection object, and one or more ineffective combinations each of which does not multiply protect a symbol in the first symbol string. Accordingly, when the number of chunks to be generated from user data is larger than the number of effective combinations of at least two component codes among a plurality of component codes that constitute a multi-dimensional error correction code, the distributor 170 allocates input destinations for some chunks of the plurality of chunks to respective ones of all the effective combinations, and then determines input destinations for the rest of the chunks from combinations overlapping with the combinations to which input destinations have already been allocated. With this arrangement, even when the number chunks to be generated is larger than the number of combinations of the encoders for the dimension 1 and the encoders for the dimension 2, the encoding part 17 can generate a multi-dimensional error correction code having a different encoding rate and a different code structure, without changing its configuration and without lowering the throughput.

However, even in a case that allows the same combination of an encoder for the dimension 1 and an encoder for the dimension 2 to be allocated to a plurality of chunks, when the number of chunks is larger than the number of encoders 173a to 173e for the dimension 1, the distributor 170 determines the encoders for the dimension 1 to serve as input destinations for the respective chunks, such that the numbers of chunks to be input into the respective encoders 173a to 173e for the dimension 1 are equal to each other, or the difference between these numbers of chunks is equal to or smaller than a predetermined threshold (for example, one or two) set in advance. Similarly, when the number of chunks is larger than the encoders 174a and 174b for the dimension 2, the distributor 170 determines the encoders for the dimension to serve as input destinations for the respective chunks, such that the numbers of chunks to be input into the respective encoders 174a and 174b for the dimension are equal to each other, or the difference between these numbers of chunks is equal to or smaller than a predetermined threshold (for example, one or two) set in advance.

As described above, in this embodiment, user data having a large symbol length is fragmented into pieces (chunks) each having a relatively small symbol length. Each chunk is composed of one or more symbols. By dispersing relatively small chunks to a plurality of component codes and following a cyclic rule suitably designed, it is possible to achieve a memory system that can encode multi-dimensional error correction codes having various code structures, without changing its configuration and without lowering the throughput.

Further, for example, as in the product code 300 illustrated in FIG. 7 and the product code 500 illustrated in FIG. 9, encoding is executed such that the array of information bits of a multi-dimensional error correction code to be generated becomes different from the array of information bits of the original user data. Consequently, it is possible to achieve a memory system that can exert high correction performance even to burst errors, without additionally mounting a function for rearranging a bit array, such as an interleaver.

Second Embodiment

Next, an explanation will be given of a memory system according to a second embodiment in detail with reference to drawings. A schematic configuration of the memory system according to this embodiment may be the same as that of the memory system 1 described with reference to FIG. 5 in the first embodiment. Thus, hereinafter, its repetitive description will be omitted. However, in the second embodiment, the encoding part 17 of the encoding/decoding part 14 is replaced with an encoding part described below.

Figure 10:
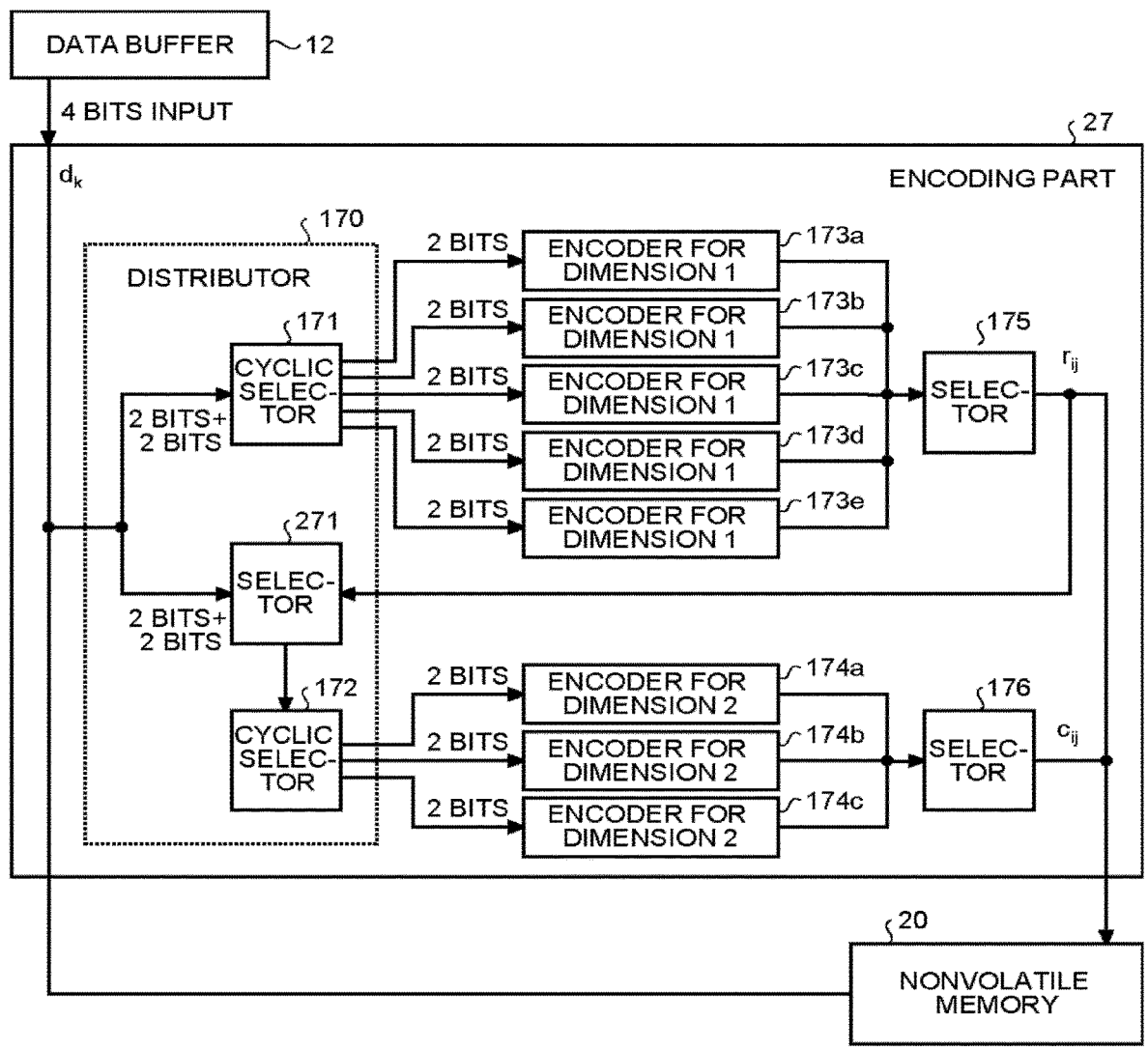
FIG. 10 is a block diagram illustrating a schematic configuration example of an encoding part according to a second embodiment.

FIG. 10 is a block diagram illustrating a schematic configuration example of an encoding part according to the second embodiment. Here, in FIG. 10, for the sake of clarification of the explanation, the parts of the memory controller 10 other than the encoding part are omitted.

As illustrated in FIG. 10, the encoding part 27 further includes a selector 271 in the distributor 170, in addition to the same configuration of the encoding part 17 described with reference to FIG. 6 in the first embodiment. Further, a third column encoder 174c for the dimension is added, as a matter of convenience.

Chunks generated by the distributor 170 from information bits input therein are input into the selector 271. Further, parities of the dimension 1 output from the selector 175 for the dimension 1 are input as chunks into the selector 271. On the other hand, the output of the selector 271 is input into the cyclic selector 172.

During the time when information bits are being input from the data buffer 12, the selector 271 inputs chunks of information bits generated by the distributor 170 into the cyclic selector 172. Accordingly, the operation of the encoding part 27 during this time is the same as the operation of the encoding part 17 illustrated in the first embodiment.

On the other hand, when parities generated by any one of the encoders 173a to 173e for the dimension 1 are output from the selector 175 for the dimension 1, the selector 271 inputs the parities input from the selector 175 for the dimension 1, into the cyclic selector 172 for the dimension 2 as chunks.

The cyclic selector 172 for the dimension performs its action on the chunks of parities input from the selector 271, in the same way as the action on the chunks of information bits. Accordingly, the cyclic selector 172 inputs each of the plurality of chunks, which have been sequentially input therein, into any one of the encoders 174a to 174c for the dimension 2, by keeping the order of chunks and in accordance with a predetermined period.

When all the information bits of user data stored in the data buffer 12 and all the parities generated by the encoders 173a to 173e for the dimension 1 have been distributed into the encoders 174a to 174c for the dimension 2 via the distributor 170, the encoders 174a to 174c for the dimension execute encoding to the information bits and parities input into the respective encoders, to generate parities of the dimension 2, and output the parities thus generated into the selector 176 for the dimension 2. The subsequent operations are the same as those of the first embodiment, and thus their description in detail will be omitted here.

Figure 11:
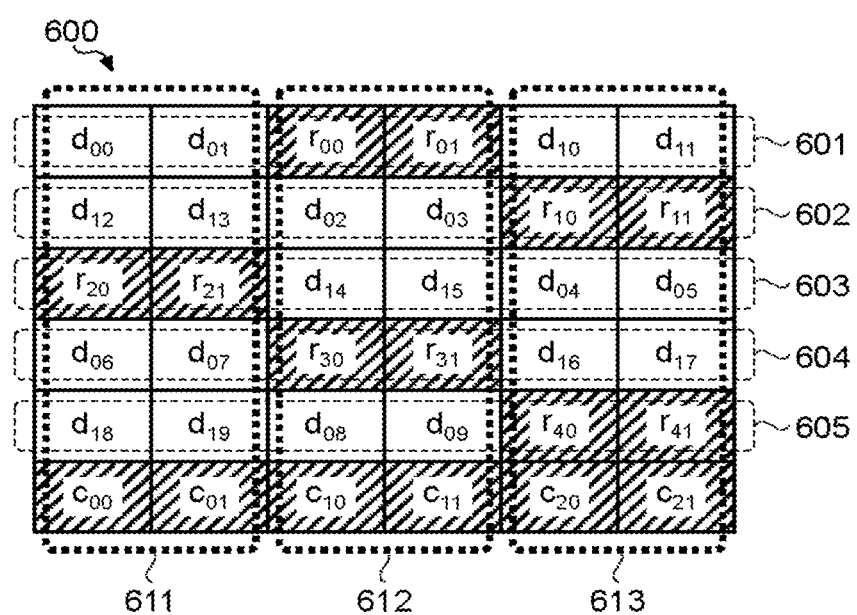
FIG. 11 is a diagram illustrating an example of a multi-dimensional error correction code to be generated in the second embodiment.

FIG. 11 is a diagram illustrating an example of a product code to be generated by the encoding part 27 illustrated in FIG. 10. As illustrated in FIG. 11, the product code 600 is composed of totally twenty information bits $d_{00}$ to $d_{19}$ and totally sixteen parities $r_{00}$ to $r_{41}$ and $c_{00}$ to $c_{21}$.

When such a product code 600 is to be generated, in the encoding part $2i$, the period of the cyclic selector 171 for the dimension 1 is set to five cycles and the period of the cyclic selector 172 for the dimension 2 is set to three cycles. The distributor 170 divides the four information bits input therein in one cycle into two chunks, each of which is composed of two information bits, and sequentially inputs the two chunks thus generated into the respective cyclic selectors 171 and 172.

The distributor 170 distributes all the chunks $(d_{00}, d_{01})$, $(d_{02}, d_{03})$, $(d_{04}, d_{05})$, - - -, and $(d_{18}, d_{19})$ generated from the information bits $d_{00}$ to $d_{19}$ input therein, into the encoders 173a to 173e for the dimension 1 and the encoders 174a to 174c for the dimension 2. Then, the distributor 170 sequentially inputs chunks $(r_{00}, r_{01})$, - - -, and $(r_{40}, r_{41})$ of parities of the dimension 1, which have been input into the selector 271 from the selector 175 for the dimension 1, into the cyclic selector 172 for the dimension 2. The cyclic selector 172 for the dimension 2 inputs each of the chunks of parities of the dimension 1 input therein, into any one of the encoders 74a to 174c for the dimension 2, in accordance with the input order of chunks and a set period.

In the example illustrated in FIGS. 10 and 11, a chunk $(r_{00}, r_{01})$ composed of the first row parities generated by the encoder 173a for the dimension 1 and a chunk $(r_{33}, r_{31})$ composed of the fourth row parities generated by the encoder 173d for the dimension 1 are input into the second column encoder 174b for the dimension 2. Further, a chunk $(r_{10}, r_{11})$ composed of the second row parities generated by the encoder 173b for the dimension 1 and a chunk $(r_{40}, r_{41})$ composed of the fifth row parities generated by the encoder 173e for the dimension 1 are input into the third column encoder 174c for the dimension 2. Further, a chunk $(r_{20}, r_{21})$ composed of the third row parities generated by the encoder 173c for the dimension 1 is input into the first column encoder 174a for the dimension 2.

The encoders 174a to 174c for the dimension 2 execute encoding to the information bits and parities input into the respective encoders, to generate parities $c_{00}$ to $c_{21}$ of the dimension 2, and output the parities $c_{00}$ to $c_{21}$ thus generated into the selector 176 for the dimension 2.

As described above, the encoding part 27 according to this embodiment is configured to input parities generated in relation to one of the dimensions into the encoders for the other of the dimensions. Consequently, while considering these parities generated in relation to one of the dimensions as a protection object, the encoding part 27 can generate parities in relation to the other of the dimensions. As a result, it is possible to protect user data more firmly.

The other arrangements, operations, and effects are the same as those of the first embodiment, and thus their description in detail will be omitted here.

Third Embodiment

Next, an explanation will be given of a memory system according to a third embodiment in detail with reference to drawings. In this embodiment, an explanation will be given of a more specific configuration example of the decoding part 18 in the embodiments described above. A schematic configuration of the memory system according to this embodiment may be the same as that of the memory system 1 described with reference to FIG. 5 in the first embodiment. Thus, hereinafter, its repetitive description will be omitted.

Figure 12:
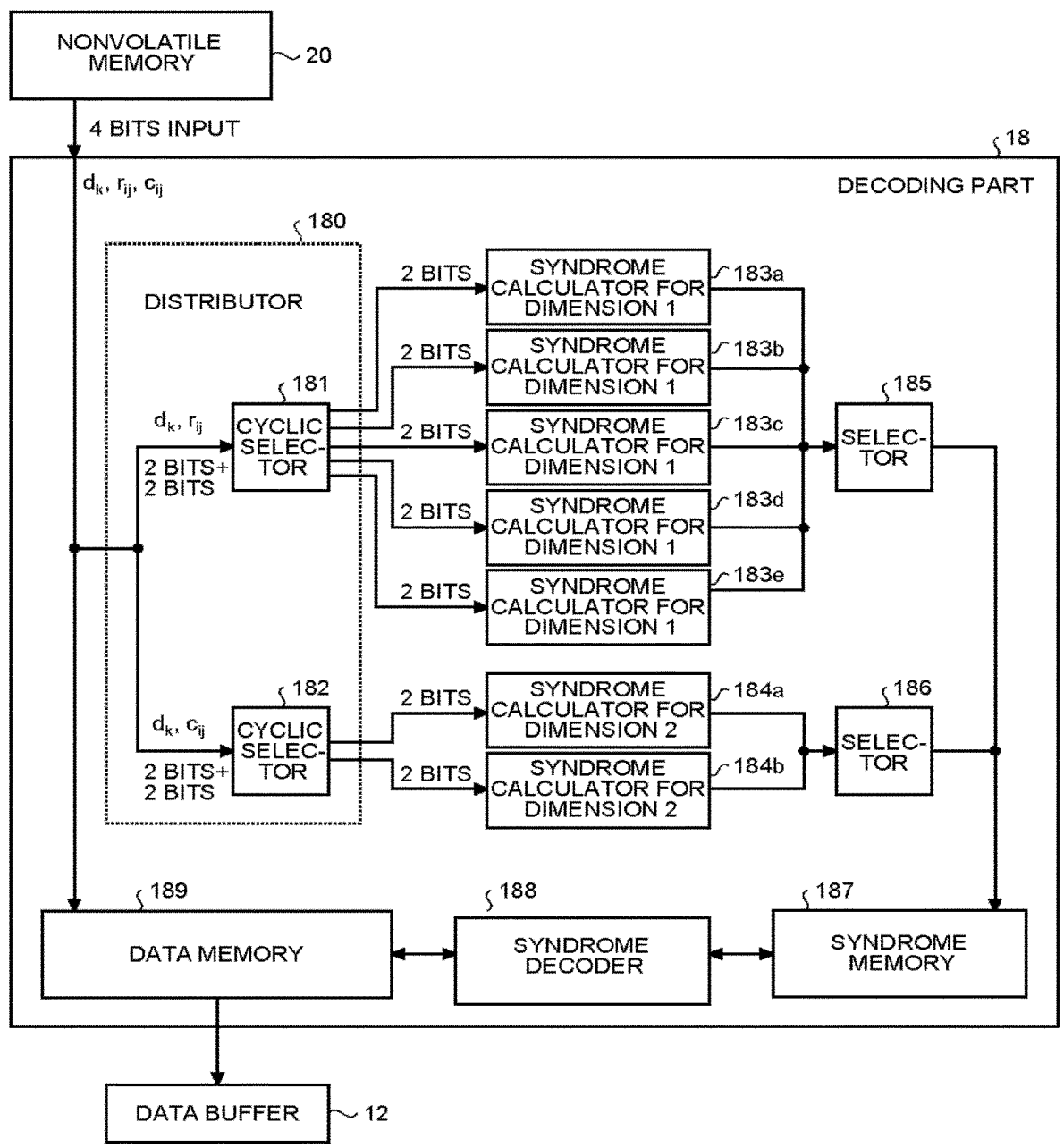
FIG. 12 is a block diagram illustrating a schematic configuration example of a decoding part according to a third embodiment.

FIG. 12 is a block diagram illustrating a schematic configuration example of the decoding part 18 according to this embodiment. Here, in FIG. 12, for the sake of clarification of the explanation, the parts of the memory controller 10 other than the decoding part are omitted.

As illustrated in FIG. 12, the decoding part 18 includes a distributor 180 that distributes information bits input therein; syndrome calculators 183a to 183e for the dimension 1 in the same number as the number of component codes (five) of the dimension 1; syndrome calculators 184a and 183b for the dimension 2 in the same number as the number of component codes (two) of the dimension 2; selectors 185 and 186 provided for the respective dimensions; a syndrome memory 187; a syndrome decoder 188; and a data memory 189. Further, the distributor 180 includes cyclic selectors 181 and 182 provided for the respective dimensions, as in the distributor 170 of the encoding part 17/27.

A reception word read from the nonvolatile memory 20 by the memory I/F 13 is input into the decoding part 18 by four bits in each cycle directly, or after being temporarily buffered in an internal memory inside the encoding/decoding part 14. The reception word thus read includes information bits $d_k$, which correspond to user data treated as a reading object, parities $r_{ij}$ of the dimension 1, and parities $c_{ij}$ of the dimension 2.

Data of four bits input into the decoding part 19 is accumulated in the data memory 189, and is input into the distributor 180. The distributor 180 divides the data of four bits into a plurality of (two, in this example) chunks, each of which is composed of one or more bits (two bits, in this example), and sequentially inputs the plurality of chunks thus generated into the cyclic selectors 181 and 182 for the respective dimensions. At this time, the distributor 180 inputs chunks composed of information bits into both of the cyclic selector 181 for the dimension 1 and the cyclic selector 182 for the dimension 2. Further, the distributor 180 inputs chunks composed of parities of the dimension 1 into the cyclic selector 181 for the dimension 1, and inputs chunks composed of parities of the dimension 2 into the cyclic selector 182 for the dimension 2.

The cyclic selector 181 for the dimension 1 inputs each of the chunks of information bits and the chunks of parities of the dimension 1, which have been sequentially input therein, into any one of the syndrome calculators 183a to 183e for the dimension 1, by keeping the order of chunks and in accordance with a set period. For example, in a case where the number of component codes of the dimension 1 is five and the five syndrome calculators 183a to 183e for the dimension 1 are used, the period of the cyclic selector 181 is set to five cycles. Consequently, the first row component codes are input into the first row syndrome calculator 183a for the dimension 1. The second row component codes are input into the second row syndrome calculator 183b for the dimension 1. The third row component codes are input into the third row syndrome calculator 183c for the dimension 1. The fourth row component codes are input into the fourth row syndrome calculator 183d for the dimension 1. The fifth row component codes are input into the fifth row, syndrome calculator 183e for the dimension 1. Here, setting of the period to the cyclic selectors 181 and 182 may be performed by the distributor 180.

When the syndrome calculators 183a to 183e for the dimension 1 receive input of the component codes corresponding to the respective calculators, the syndrome calculators 183a to 183e calculate respective syndromes of the component codes input therein, and output the syndromes of the component codes thus calculated into the selector 185 for the dimension 1. The selector 185 for the dimension 1 inputs the syndromes of the component codes input therein, into the syndrome memory 167. Consequently, the syndromes in relation to the respective component codes of the dimension 1 are recorded into the syndrome memory 187.

On the other hand, the cyclic selector 182 for the dimension 2 inputs each of the chunks of information bits and the chunks of parities of the dimension 2, which have been sequentially input therein, into either one of the syndrome calculators 184a and 184b for the dimension 2, by keeping the order of chunks and in accordance with a set period. For example, in a case where the number of component codes of the dimension 2 is two and the two syndrome calculators 184a and 183b for the dimension 2 are used, the period of the cyclic selector 182 is set to two cycles. Consequently, the first column component codes are input into the first column syndrome calculator 184a for the dimension 2. The second column component codes are input into the second column syndrome calculator 184b for the dimension 2.

When the syndrome calculators 184a and 183b for the dimension 2 receive input of the component codes corresponding to the respective calculators, the syndrome calculators 184a and 183b calculate respective syndromes of the component codes input therein, and output the syndromes of the component codes thus calculated into the selector 186 for the dimension 2. The selector 196 for the dimension 2 inputs the syndromes of the component codes input therein, into the syndrome memory 187. Consequently, the syndromes in relation to the respective component codes of the dimension 2 are recorded into the syndrome memory 187.

Here, it is sufficient if the cyclic selectors 181 and 182 are set with periods the same as the periods set to the cyclic selectors 171 and 172 of the distributor 170 in the encoding part 17/27 illustrated in the first or second embodiment, where the latter periods are set when user data treated as a reading object is to be encoded.

When all the bit of the reception word are read from the nonvolatile memory 20 and are input into the decoding part 18 as described above, the entire reception word is accumulated in the data memory 189. Further, when the syndromes of all the component codes of the dimensions 1 and 2 are stored in the syndrome memory 187, the syndrome decoder 188 finds one or more error hits in the reception word (codeword) inside the data memory 189, and executes error correction to the error bits thus found inside the data memory 189. Further, the syndrome decoder 188 corrects the syndromes for the error-corrected hits inside the syndrome memory 187, on the basis of the error-corrected bits.

Thereafter, when all the error bits in the codeword inside the data memory 189 have been corrected by the syndrome decoder 188, user data sent as a writing object from the host 30 is restored inside the data memory 189. For example, the user data thus restored is read from the data memory 189 and is once stored into the data buffer 12, and is then transmitted to the host 30, which is the reading request source, via the host I/F 15.

As described above, the decoding part 18 according to this embodiment can decode various multi-dimensional error correction codes encoded by the encoding parts 17 and 27 according to the first and second embodiments (for example, see FIGS. 2, 4, to 9, and 11). In other words, according to this embodiment, it is possible to achieve the decoding part 18 that can decode a multi-dimensional error correction code having a different encoding rate and a different code structure, without changing its configuration and without lowering the throughput. Further according to this embodiment, it is possible to achieve a memory system that can exert high correction performance even to burst errors.

The other arrangements, operations, and effects are the same as those of the embodiments described above, and thus their description in detail will be omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory;
   an encoding part configured to generate a plurality of component codes including a first component code and a second component code different from the first component code, by using, as an information symbol, at least one symbol of a plurality of symbols included in user data to be written into the nonvolatile memory; and
   a memory interface configured to write the plurality of component codes into the nonvolatile memory,
   wherein the encoding part includes
      a plurality of encoders each configured to generate a parity corresponding to each of the plurality of component codes, and
      a first distributor configured to divide a first symbol string of the user data into a plurality of chunks, each of which has a first symbol length smaller than that of the first symbol string, and to input each of the plurality of chunks generated by the division, into any one of at least different two of the plurality of encoders, and wherein the memory interface is configured to write the first symbol string and parities corresponding to the first symbol string into the nonvolatile memory, the first component code is a component code of a first dimension, the second component code is a component code of a second dimension different from the first dimension, the plurality of encoders includes one or more first encoders each configured to generate a parity of the component code of the first dimension, and one or more second encoders each configured to generate a parity of the component code of the second dimension, and the first distributor is configured to input each of the chunks into any one of the one or more first encoders and into any one of the one or more second encoders, and wherein combinations of at least two component codes among the plurality of component codes include one or more effective combinations each of which multiply protects at least one symbol in the first symbol string, and one or more ineffective combinations each of which does not multiply protect a symbol in the first symbol string, and when a number of chunks is equal to or smaller than a number of the effective combinations, the first distributor determines combinations of encoders to serve as respective input destinations for the plurality of chunks, such that a combination of encoders for the component codes, into which one chunk of the plurality of chunks is to be input, does not overlap with a combination of encoders for the component codes, into which another chunk is to be input.

2. The memory system according to claim 1, wherein when a number of chunks is larger than number of the effective combinations, the first distributor allocates input destinations for some chunks of the plurality of chunks to respective ones of all the effective combinations, and then determines input destinations for rest of the chunks from combinations overlapping with combinations to which input destinations have already been allocated.

3. The memory system according to claim 1, wherein when the number of chunks is larger than the number of the effective combinations, the first distributor determines combinations of encoders to serve as respective input destinations for the plurality of chunks, such that a difference between numbers of chunks to be input into the respective effective combinations is equal to or smaller than a predetermined threshold.

4. The memory system according to claim 1, wherein, when a number of chunks is larger than a number of encoders for component codes of the first dimension, the first distributor determines encoders for component codes of the first dimension to serve as respective input destinations for the plurality of chunks, such that a difference between numbers of chunks to be input into the respective encoders for component codes of the first dimension is equal to or smaller than a predetermined threshold.

5. The memory system according to claim 1, wherein, when a number of chunks is larger than a number of encoders for component codes of the second dimension, the first distributor determines encoders for component codes of the second dimension to serve as respective input destinations for the plurality of chunks, such that a difference between numbers of chunks to be input into the respective encoders for component codes of the second dimension is equal to or smaller than a predetermined threshold.

6. The memory system according to claim 1, wherein the first distributor includes
a first cyclic selector configured to input each of the plurality of chunks into any one of the encoders for component codes of the first dimension, in order in accordance with an arrangement of the first symbol string,
a second cyclic selector configured to input each of the plurality of chunks into any one of the encoders for component codes of the second dimension, in order in accordance with an arrangement of the first symbol string, the first distributor is configured to set the first cyclic selector with a first period including a number of cycles in a same number as a number of component codes of the first dimension, and to set the second cyclic selector with a second period including a number of cycles in a same number as a number of component codes of the second dimension,
the first cyclic selector is configured to input in a dispersed state the plurality of chunks into some of the first encoders in a same number as the number of cycles of the first period, and
the second cyclic selector is configured to input n a dispersed state the plurality of chunks into some of the second encoders in a same number as the number of cycles of the second period.

7. The memory system according to claim 1, wherein the first distributor further includes a selector configured to receive input of the plurality of chunks and respective parities of the plurality of component codes, and
the selector is configured to calculate a parity of a third component code of the plurality of component codes, and then to input the parity of the third component code into an encoder for a fourth component code, a parity of which has not yet been calculated.

8. The memory system according to claim 1, wherein e first distributor is configured to receive input of the user data in units of a second symbol string that has a second symbol length equal to or larger than the first symbol length and smaller than that of the first symbol string, and to divide the second symbol string into one or more chunks.

9. The memory system according to claim 1, comprising:
a first syndrome calculator configured to calculate a first syndrome of the first component code;
a second syndrome calculator configured to calculate a second syndrome of the second component code;
a second distributor configured to divide a third symbol string read from the nonvolatile memory by the memory interface into a plurality of chunks, each of which has the first symbol length as in the first distributor, and to input chunks corresponding to user data to be read and chunks corresponding to parities of a first dimension, of the plurality of chunks generated by the division, into the first syndrome calculator, and input the chunks corresponding to the user data to be read and chunks corresponding to parities of a second dimension, of the plurality of chunks, into the second syndrome calculator, a syndrome memory configured to hold the first syndrome calculated by the first syndrome calculator and the second syndrome calculated by the second syndrome calculator, and a syndrome decoder configured to decode the first syndrome and the second syndrome held by the syndrome memory and thereby detect an error symbol in the third symbol string, and to correct the detected error symbol.

10. A memory system comprising:

a nonvolatile memory;

an encoding part configured to generate a plurality of component codes by using at least one symbol of a plurality of symbols included in user data to be written into the nonvolatile memory, the plurality of component codes including a first component code and a second component, the second component code being different from the first component code; and a memory interface configured to write the generated plurality of component codes into the nonvolatile memory, wherein the encoding part includes a distributor, one or more first encoders, and one or more second encoders, the distributor is configured to divide a first symbol string of the user data into a plurality of chunks, each chunk having a symbol length smaller than that of the first symbol string and having a same symbol length with each other, and to distribute the divided chunks into the one or more first encoders and into the one or more second encoders, each of the one or more first encoders is configured to generate from the input chunks a first parities each corresponding to the first component code, each of the one or more second encoders is configured to generate from the input chunks a second parities each corresponding to the second component code, and the memory interface is configured to write, as the generated plurality of component codes, the first symbol string, the first parities and the second parities into the nonvolatile memory.

11. A memory system comprising:

a nonvolatile memory;

an encoding part configured to generate a plurality of component codes including a first component code and a second component code different from the first component code, by using, as an information symbol, at least one symbol of a plurality of symbols included in user data to be written into the nonvolatile memory; and a memory interface configured to write the plurality of component codes into the nonvolatile memory, wherein the encoding part includes a plurality of encoders each configured to generate a parity corresponding to each of the plurality of component codes, and a first distributor configured to divide a first symbol string of the user data into a plurality of chunks, each of which has a first symbol length smaller than that of the first symbol string and has a same symbol length with each other, and to distribute each of the plurality of chunks generated by the division, into any one of at least different two of the plurality of encoders, and wherein the memory interface is configured to write the first symbol string and parities corresponding to the first symbol string into the nonvolatile memory, the first component code is a component code of a first dimension, the second component code is a component code of a second dimension different from the first dimension, the plurality of encoders includes one or more first encoders each configured to generate a parity of the component code of the first dimension, and one or more second encoders each configured to generate a parity of the component code of the second dimension, and the first distributor is configured to distribute each of the chunks into any one of the one or more first encoders and into any one of the one or more second encoders.

12. The memory system according to claim 11, wherein combinations of at least two component codes among the plurality of component codes include one or more effective combinations each of which multiply protects at least one symbol in the first symbol string, and one or more ineffective combinations each of which does not multiply protect a symbol in the first symbol string, and when a number of chunks is equal to or smaller than a number of the effective combinations, the first distributor determines combinations of encoders to serve as respective input destinations for the plurality of chunks, such that a combination of encoders for the component codes, into which one chunk of the plurality of chunks is to be distributed, does not overlap with a combination of encoders for the component codes, into which another chunk is to be distributed.

13. The memory system according to claim 11, wherein combinations of at least two component codes among the plurality of component codes include one or more effective combinations each of which multiply protects at least one symbol in the first symbol string, and one or more ineffective combinations each of which does not multiply protect a symbol in the first symbol string, and when a number of chunks is larger than a number of the effective combinations, the first distributor allocates input destinations for some chunks of the plurality of chunks to respective ones of all the effective combinations, and then determines input destinations for rest of the chunks from combinations overlapping with combinations to which input destinations have already been allocated.

14. The memory system according to claim 11, wherein when the number of chunks is larger than the number of the effective combinations, the first distributor determines combinations of encoders to serve as respective input destinations for the plurality of chunks, such that a difference between numbers of chunks to be distributed into the respective effective combinations is equal to or smaller than a predetermined threshold.

15. The memory system according to claim 11, wherein, when a number of chunks is larger than a number of encoders for component codes of the first dimension, the first distributor determines encoders for component codes of the first dimension to serve as respective input destinations for the plurality of chunks, such that a difference between numbers of chunks to be distributed into the respective encoders for component codes of the first dimension is equal to or smaller than a predetermined threshold.

16. The memory system according to claim 11, wherein, when a number of chunks is larger than a number of encoders for component codes of the second dimension, the first distributor determines encoders for component codes of the second dimension to serve as respective input destinations for the plurality of chunks, such that a difference between numbers of chunks to be distributed into the respective encoders for component codes of the second dimension is equal to or smaller than a predetermined threshold.

17. The memory system according to claim 11, wherein the first distributor includes
   a first cyclic selector configured to distribute each of the plurality of chunks into any one of the encoders for component codes of the first dimension, in order in accordance with an arrangement of the first symbol string,
   a second cyclic selector configured to distribute each of the plurality of chunks into any one of the encoders for component codes of the second dimension, in order in accordance with an arrangement of the first symbol string, the first distributor is configured to set the first cyclic selector with a first period including a number of cycles in a same number as a number of component codes of the first dimension, and to set the second cyclic selector with a second period including a number of cycles in a same number as a number of component codes of the second dimension,
   the first cyclic selector is configured to distribute in a dispersed state the plurality of chunks into some of the first encoders in a same number as the number of cycles of the first period, and
   the second cyclic selector is configured to distribute in a dispersed state the plurality of chunks into some of the second encoders in a same number as the number of cycles of the second period.

18. The memory system according to claim 11, wherein the first distributor further includes a selector configured to receive input of the plurality of chunks and respective parities of the plurality of component codes, and
   the selector is configured to calculate a parity of a third component code of the plurality of component codes, and then to distribute the parity of the third component code into an encoder for a fourth component code, a parity of which has not yet been calculated.

19. The memory system according to claim 11, wherein
   the first distributor is configured to receive input of the user data in units of a second symbol string that has a second symbol length equal to or larger than the first symbol length and smaller than that of the first symbol string, and to divide the second symbol string into one or more chunks.

20. The memory system according to claim 11, comprising:
   a first syndrome calculator configured to calculate a first syndrome of the first component code;
   a second syndrome calculator configured to calculate a second syndrome of the second component code;
   a second distributor configured to divide a third symbol string read from the nonvolatile memory by the memory interface into a plurality of chunks, each of which has the first symbol length as in the first distributor, and to distribute chunks corresponding to user data to be read and chunks corresponding to parities of a first dimension, of the plurality of chunks generated by the division, into the first syndrome calculator, and distribute the chunks corresponding to the user data to be read and chunks corresponding to parities of a second dimension, of the plurality of chunks, into the second syndrome calculator,
   a syndrome memory configured to hold the first syndrome calculated by the first syndrome calculator and the second syndrome calculated by the second syndrome calculator, and
   a syndrome decoder configured to decode the first syndrome and the second syndrome held by the syndrome memory and thereby detect an error symbol in the third symbol string, and to correct the detected error symbol.

* * * * *